United States Patent [19]

Wood

[11] Patent Number: 4,532,435
[45] Date of Patent: Jul. 30, 1985

[54] PULSE WIDTH MODULATOR HAVING NONLINEAR TRANSFER FUNCTION

[75] Inventor: Jonathan R. Wood, Sudbury, Mass.

[73] Assignee: Data General Corporation, Westboro, Mass.

[21] Appl. No.: 396,590

[22] Filed: Jul. 9, 1982

[51] Int. Cl.³ .................. H03K 3/017; G06G 7/12
[52] U.S. Cl. .................................. 307/265; 307/490
[58] Field of Search ............... 307/265, 490; 328/111, 328/112, 127; 318/599; 363/26, 41

[56] References Cited

U.S. PATENT DOCUMENTS

| | | | |
|---|---|---|---|
| 3,277,395 | 10/1966 | Grindle et al. | 328/112 |
| 3,416,052 | 12/1968 | Russell et al. | 318/599 |
| 4,223,378 | 9/1980 | Koizumi | 363/26 |
| 4,293,902 | 10/1981 | White | 363/26 |
| 4,388,694 | 6/1983 | Loveland | 328/127 |

Primary Examiner—Stanley D. Miller
Assistant Examiner—B. P. Davis
Attorney, Agent, or Firm—Robert L. Dulaney

[57] ABSTRACT

A pulse width modulator circuit for use with DC power converters. The circuit contains an oscillator having a nonlinear output, a first comparator for comparing the output of the oscillator with an input voltage, and a second comparator for selecting portions of the output waveform of the first comparator for supplying to the output of the modulator.

6 Claims, 5 Drawing Figures

QUAD COMPARATOR MODULATOR

TWO-TRANSISTOR FORWARD-MODE DC-DC CONVERTER

QUAD COMPARATOR MODULATOR

MODULATOR TIMING

MODULATOR TRANSFER FUNCTION

4,532,435

PULSE WIDTH MODULATOR HAVING NONLINEAR TRANSFER FUNCTION

BACKGROUND OF THE INVENTION

1. Field of the Invention

The present invention relates generally to pulse width modulated power supplies and more particularly to pulse width modulator circuitry having a gain inversely proportional to the supply voltage of the voltage converter.

2. Description of the the Prior Art

Pulse width modulation DC—DC converters are well known in the art. Modern products incorporating DC—DC converters, such as digital computers, must be designed to operate successfully and accurately over the wide range of supply voltages which the products will encounter in various countries around the world. Unless the manufacturer customizes his product for each country in which the product is sold, the converter must be capable of accepting supply voltage which vary by as much as a factor of 2 from one country to another. Prior art converters typically use "linearly ramped" modulators in which the modulator gain is independent of the duty cycle. Therefore, since the incremental gain of the power converter portion of the converter will vary with the level of the supply voltage, the converter will have different closed-loop gains for different supply voltage levels. This variation in gain means that the regulation performance of the converter will not be uniform across the entire range of anticipated supply voltages. For example, if, as is common, a converter is designed for optimum performance at the higher supply voltages, the regulation at lower supply voltages will suffer.

One known prior art switching regulator which incorporates a quad comparator integrated circuit modulator is shown on page 230 of *Switching Regulators and Power Supplies with Practical Inverters and Converters* (copyright 1976,TAB Books) by Irving Gottlieb. The Gottlieb modulator, like the typical modulator, is designed to have a substantially linear ramp and is, therefore, also subject to the problem of non-uniform gain.

This and other problems of the prior art are solved by the present invention.

BRIEF SUMMARY OF THE INVENTION

It is a primary object of the invention to provide an improved pulse width modulator having a nonlinear transfer function.

A circuit for implementing the invention includes oscillator apparatus capable of generating a nonlinear output, apparatus for comparing the oscillator output with an input voltage and apparatus for supplying a representation of selected portions of the output of the comparing apparatus to the output of the modulator.

It is an advantage of the present invention that the loop gain of a closed-loop converter employing the invention is substantially independent of the supply voltage to the power converter.

It is a further advantage that the circuit using a quad comparator integrated circuit can concurrently provide both a 50% duty cycle output and a 100% duty cycle output.

It is another advantage that the invention can be implemented using a standard quad comparator integrated circuit at a lower cost than using an available pulse width modulator integrated circuit.

It is yet another advantage that current limiting can be achieved with a very low number of parts when the invention is implemented using a standard quad comparator integrated circuit. Other objects, features and advantages of the present invention will be understood by those of ordinary skill in the art after reference to the detailed description of the preferred embodiment and accompanying drawings wherein:

DESCRIPTION OF THE PREFERRED EMBODIMENT

Figure 1:
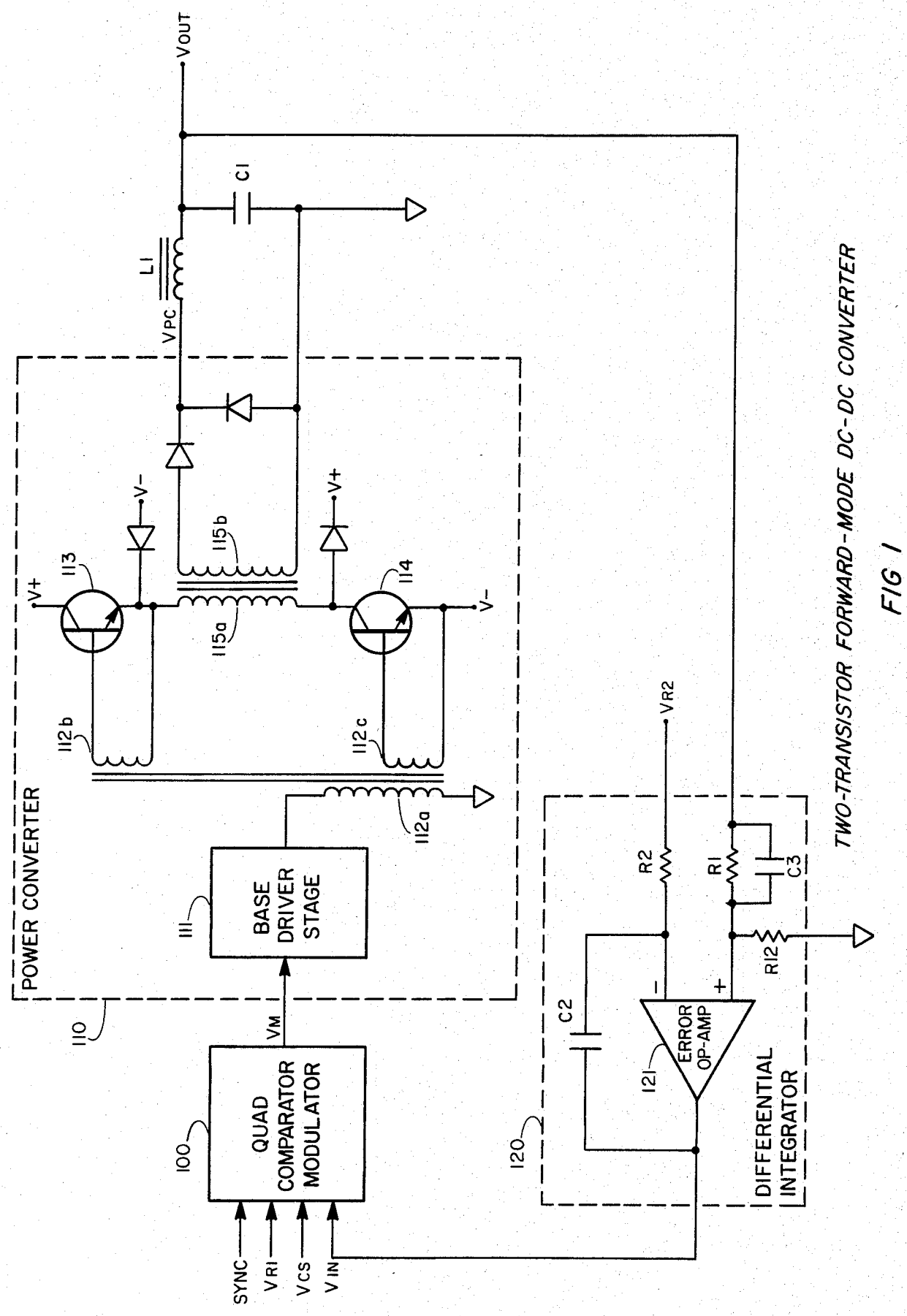
FIG. 1 is a schematic diagram of a two-transistor forward-mode DC—DC converter with which the invention may be employed.

Looking at FIG. 1, a two-transistor DC—DC converter incorporating quad comparator modulator 100 is shown. Modulator 100 receives a synchronization signal SYNC, two voltages, VRI and VCS, to be used for current limiting, and input voltage VIN. In response to these signals, as discussed in detail below, modulator 100 provides output voltage VM to Power Converter 110. Converter 110 in turn provides pulse width modulated output voltage VPC to an output filter (L1 and C1) which smooths the square wave variations in VPC to yield DC output voltage VOUT.

Power Converter 110 is shown in FIG. 1 as a typical two-transistor forward-mode DC—DC converter. As will be appreciated by those skilled in the art, variations of this converter or other types of well known converters may be applied with the modulator disclosed herein to achieve the same result. Internal to converter 110, voltage VM is provided to Base Driver Stage 111 which, depending on the value of VM, either allows or precludes current flow through primary winding 112a of transformer 112. Transformer 112 has two secondary windings, 112b and 112c, connected to transistors 113 and 114 respectively.

When VM is "high", current flows through winding 112a and, therefore, through 112b and 112c. This current turns on transistors 113 and 114, thereby activating voltage transformer 115. Voltage VPC will therefore be equal to the supply voltage times the turns ratio of windings 115b and 115a, where the supply voltage equals the positive voltage V+ supplied to the collector of transistor 113 minus the negative voltage V− supplied to the emitter of transistor 114. Filtered output voltage VOUT is provided as an output of the converter and is fed back to differential integrator 120.

In differential integrator 120, VOUT is provided through resistor R1 to the positive input of operational amplifier 121. A reference voltage VR2 is provided through resistor R2 to the negative input of operational amplifier 121. Capacitor C2 is connected between the negative input of op amp 121 and the output of op amp 121. Capacitor C3 is connected in parallel with resistor R1 and resistor R12 is connected between the positive input of op amp 121 and ground. In operation, reference voltage VR2 is compared with output voltage VOUT and the integral of the error voltage is supplied to modulator 100 as VIN.

Figure 2:
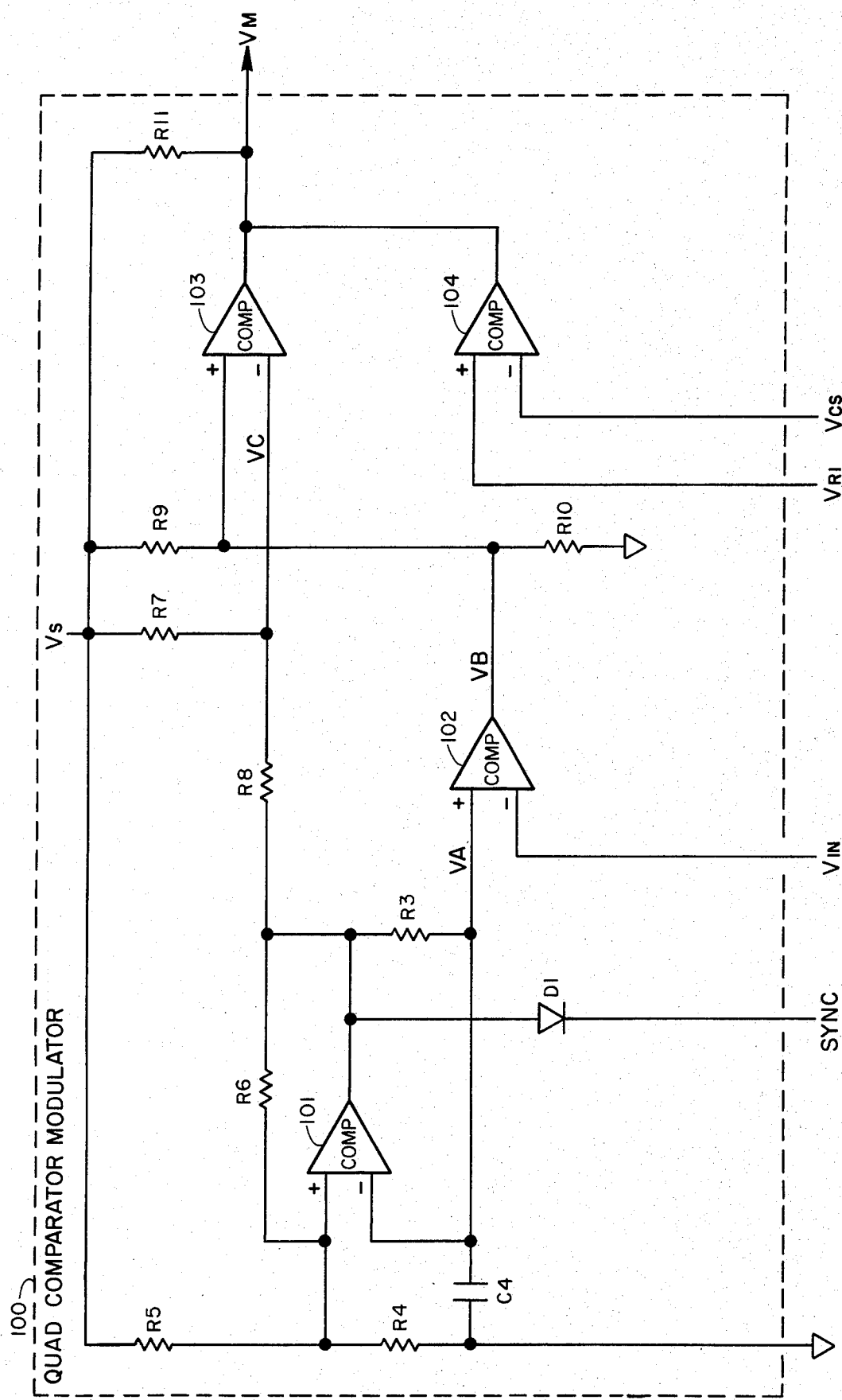
FIG. 2 is a schematic diagram of modulator 100 employing the invention.

Turning now to FIG. 2, a more detailed embodiment of modulator 100 is shown. In FIG. 2, modulator 100 is implemented with a quad comparator, for example an LM339, and is constructed to have a maximum dutycycle of 50%. The positive input of comparator 101 is connected to resistors R4, R5, and R6. The negative input of comparator 101 is connected to capacitor C4, resistor R3 and the positive input of comparator 102. The output of comparator 101 is connected to diode D1, resistor R8 and the other ends of resistors R3 and R6. The negative input of comparator 102 is connected to voltage VIN from differential amplifier 120. The output of comparator 102 is connected to resistors R9 and R10 and to the positive input of comparator 103. The negative input of comparator 103 is connected to resistor R7 and the other end of resistor R8. The positive input of comparator 104 is connected to reference voltage VR1 and the negative input is connected to sensed current voltage VCS. The outputs of comparators 103 and 104 are both connected to resistor R11 and to the modulator output voltage line VM. The other sides of resistors R5, R7, R9 and R11 are connected to supply voltage VS (typically 12 volts). The other sides of resistors R4 and R10 and capacitor C4 are connected to ground. The other side of diode D1 is connected to synchronization signal SYNC.

As implemented in FIG. 2, comparator 101, together with resistors R3, R4, R5, R6, R7, R8 and capacitor C4, functions as an oscillator, comparator 102 is the modulation comparator, comparator 103 limits the duty cycle to a maximum of 50% and comparator 104 allows for implementation of current limiting. As can be understood by one skilled in the art, the natural frequency of the oscillator portion of the circuit can be controlled by proper selection of the values of the resistors and the capacitor. The minimum and maximum voltage levels (VMIN and VMAX) are determined by resistors R3, R4, R5, R6, R7 and R8. The maximum duty cycle can be controlled by adjusting resistor R4. For example, an oscillator having a frequency of approximately 40 kHz and a difference between VMAX and VMIN of more than 50% of the level of VS results from the following component values: R3=7.5K, R4=6.8K, R5=10K, R6=2.2K, R7=2.2K, R8=1K, and C1=0.001 uf. Of course, these values are merely representative of components which might be selected by one skilled in the art. As implemented in FIG. 2, modulator 100 has a maximum possible duty cycle of approximately 49%. As will be explained in more detail below, the limiting of the maximum duty cycle of modulator 100 to 50% insures the modulator transfer function will be nonlinear.

Figure 3:
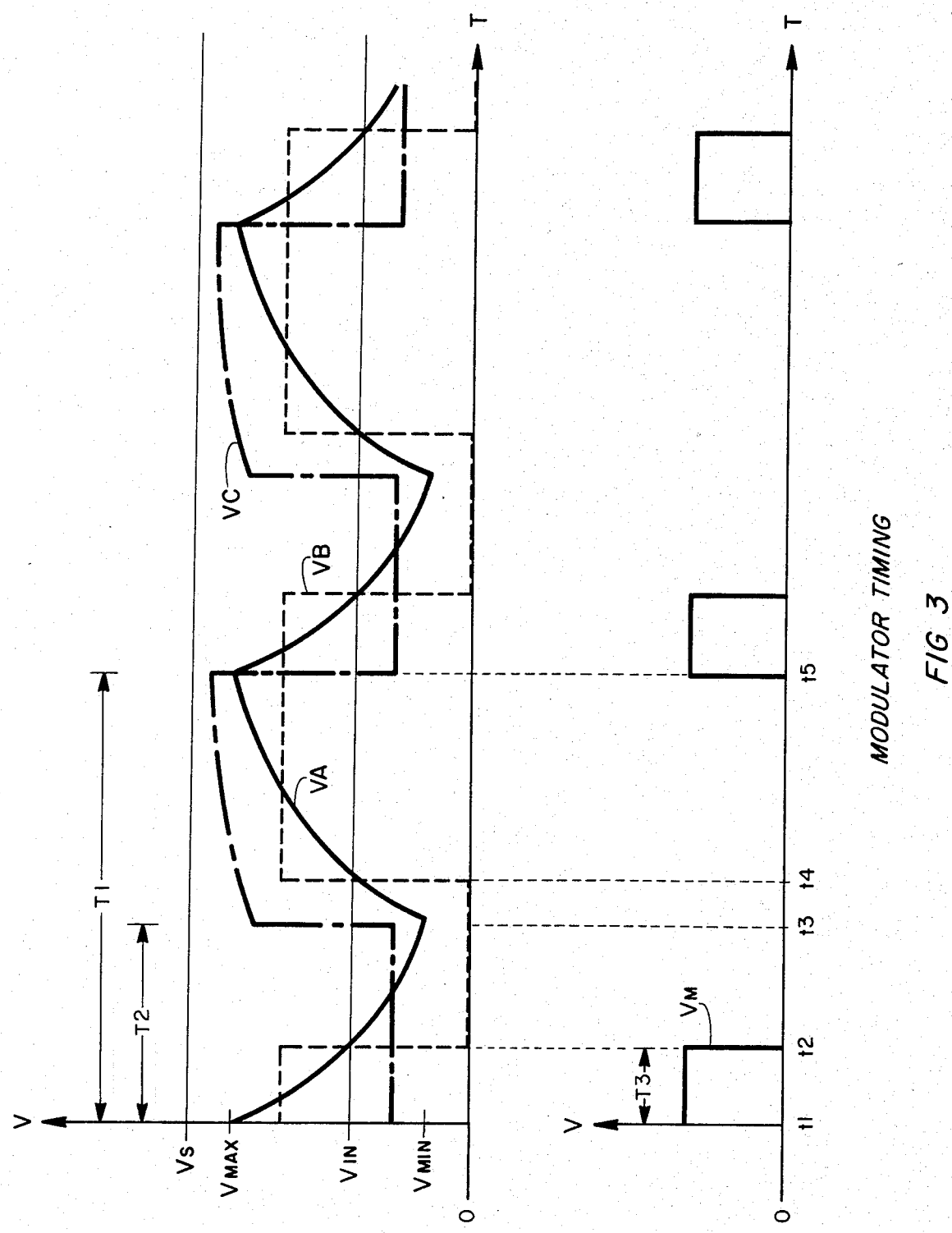
FIG. 3 is a timing diagram for modulator 100.

Looking at FIG. 3, a wave form diagram for modulator 100 is presented. VIN is the input voltage level from differential amplifier 120, VS is the supply voltage to modulator 100, VA is the output voltage of the oscillator portion of modulator 100, VB is the output voltage of comparator 102, VC is the input voltage to the negative input of comparator 103, and VM is the modulator 100 output voltage. VMAX and VMIN represent the maximum and minimum level of VA. The degree of nonlinearity of VA is related to the voltage swing between VMAX and VMIN. It is desirable to have the differential between VMAX and VMIN as large as possible, consistent with system constraints such as the operating range of op amp 121, since a large differential ensures VA retains its nonlinearity and also reduces the sensitivity of the modulator to noise impulses. In FIG. 3, time T1 is the time required for one complete oscillation of VA, time T2 is the portion of T1 during which the VA curve has a negative slope, and time T3 is the length of time that output voltage VM will be high. It can be seen that the output of the oscillator, VA, rises and falls in an exponential manner, rather than along a straight line. The duty cycle, defined as the time T3 divided by time T1, is, therefore, not a linear function of the input voltage VIN.

Referring now to FIGS. 2 and 3 together, the operation of modulator 100 will be described. In FIG. 3, at time t1, VA is at the maximum level VMAX and VMIN is at an intermediate level less than VMAX yet higher than VMIN. VB is high since the positive input to comparator 102 (i.e. VA) is greater than the negative input (i.e. VIN). VB remains high until VA falls below VIN at time t2. The negative input to comparator 102 is now the larger, therefore the output of comparator 102 (i.e. VB) goes effectively to zero. At time t3, VA reaches VMIN and the oscillator begins to increase the level of VA. At time t4, VA again becomes larger than VIN, causing VB to go high, voltage VC is higher than VB, however, therefore the output of comparator 103 (i.e. VM) is held low. At time t5, the oscillator again reaches VMAX and VA begins to decrease. VC drops to a level below the "high" level of VB, thereby forcing the output of comparator 103 (i.e. VM) high. The conditions of time t1 now exist again and the events repeat as described above.

As can be seen from FIG. 3, if VIN should increase, the time T3 will shorten, thereby reducing the length of time VM is high. This will result in a lower VOUT, which will tend, in turn, to lower VIN. Similarly, if VIN should decrease, the time T3 will lengthen, thereby increasing the length of time VM is high. This will result in a higher VOUT, which will tend to increase VIN. It is desirable that an incremental change in VIN result in a larger change in duty cycle when VIN is low than when VIN is high, therefore modulator 100 is designed to use the portion of VA between times t1 and t3.

Even if VIN drops lower than VMIN, the duty cycle will remain less than 50% since the negative input to comparator 103 (i.e. VC) will still preclude VM being high during the t3 to t5 time period. As will be appreciated by one skilled in the art, if the particular application requires only 100% maximum duty cycle, comparator 103 can simply be eliminated from the circuit. Alternatively to have both a 50% and a 100% output available, a second output line can be connected from the output of comparator 102. Since the nonlinearity of the downward sloping portion of VA (t1 to t3) would be substantially offset by the nonlinearity of the upward sloping portion (t3 to t5), however, the 100% maximum duty cycle output would not have the desirable nonlinear gain property of the 50% output.

If the SYNC line is left high at all times, modulator 100 will operate at the natural frequency of the oscillator. If, however, it is desirable to have modulator 100 operate at a specific frequency, as might be the case in an application where a plurality of converters are being used in the same device, the SYNC line can be connected to a source of periodic low-going synchronization pulses.

Referring back to FIG. 1, it can be seen that the loop gain of the converter would tend to increase with an increase in supply voltage. That is, for a given duty cycle D, the magnitude of VOUT will vary according to the magnitude of the supply voltage. Modulator 100, however, has a non-linear incremental gain which is inversely proportional to the supply voltage and, therefore, tends to offset the gain component added by power converter 110.

Figure 5:
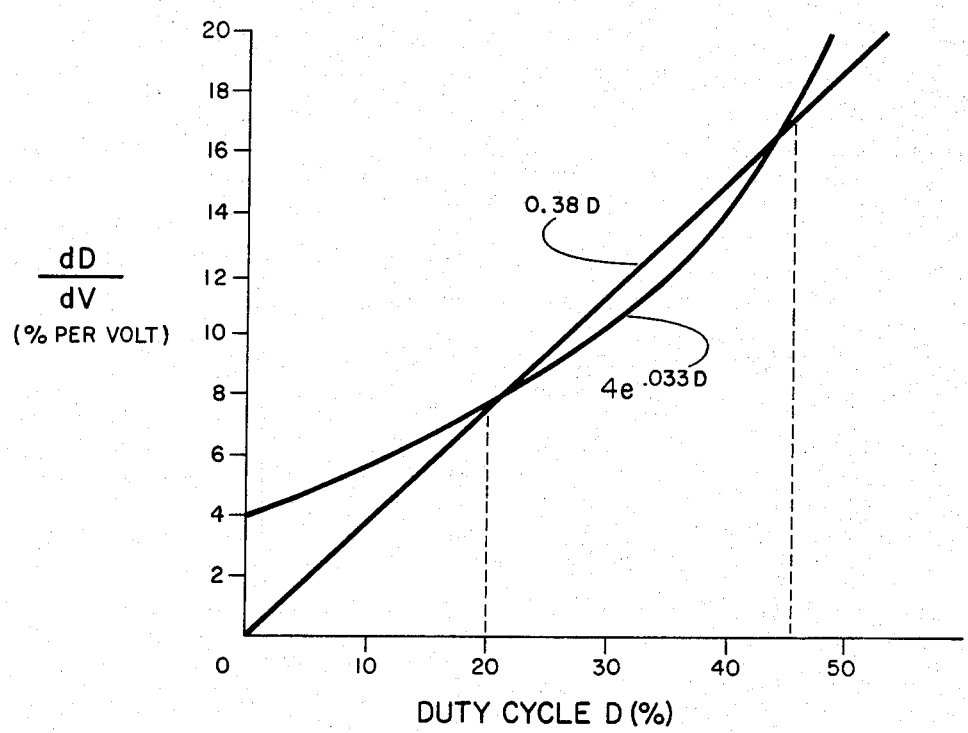
FIG. 5 is a graph which depicts incremental gain of modulator 100 as a function of duty cycle.
Figure 4:
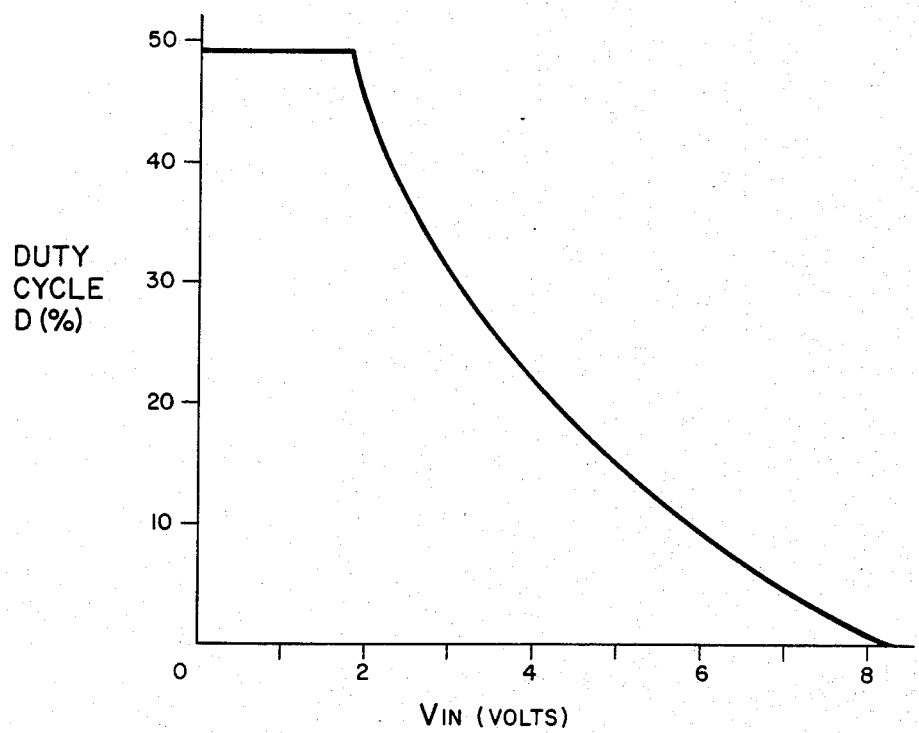
FIG. 4 is a graph which depicts the transfer function of modulator 100.

As can be determined by one skilled in the art, FIG. 4 depicts the non-linear modulator transfer function for the above identified component values in the modulator of FIG. 2. Expressing the incremental gain of modulator 100 in terms of duty cycle percent per volt (i.e. dD/dVIN), one skilled in the art can calculate that the modulator gain for the particular oscillator component values set out above is approximately 4 times e to the 0.033 D power. Referring to FIG. 5, in the range of duty cycles which are of interest in regard to this embodiment (i.e. 20% to 45%), this gain closely approximates 0.38 D.

The benefits of this gain situation can be fully appreciated by considering the effects of operating the power supply at different supply voltage levels. At operating sites where the supply voltage is high (e.g. 400 volts), the duty cycle D will be lower. Therefore the high incremental gain of power converter 110 is offset by the lower incremental gain of modulator 100 at lower duty cycles. Conversely, at sites where the supply voltage is comparatively low (e.g. 200 volts), duty cycle D will be much higher. Therefore the lower incremental gain of power converter 110 at low supply voltages is offset by the higher incremental gain of modulator 100 at higher duty cycles. In summary, the total loop gain of the DC—DC converter of FIG. 1, remains substantially constant regardless of the variation in supply voltages.

The invention may be embodied in yet other specific forms without departing from the spirit or essential characteristics thereof. The present embodiment is therefore to be considered in all respects as illustrative and not restrictive. The scope of the invention is indicated by the appended claims rather than by the foregoing description, and all changes which come within the meaning and range of equivalency of the claims are intended to be embraced therein.

I claim:

1. Apparatus for providing a pulse width modulated waveform responsive to an input voltage, said apparatus comprising:
   oscillator means for generating an output signal, said signal having alternate first portions, during each of which the output signal rises along a first path from a first voltage value to a second voltage value, and second portions, during each of which the output signal falls along a second path from said second value to said first value, at least one of said paths being nonlinear;
   means for comparing said output of said oscillator means with said input voltage; and
   means for supplying a waveform representative of selected portions of the output of said comparing means to the output of said apparatus.

2. The apparatus of claim 1 wherein said supplying means supplies a waveform representative of the output of said comparing means only during one of said portions of each oscillation of said oscillator output, said one of said portions being a portion during which said output varies in a nonlinear manner.

3. The apparatus of claim 1 wherein the magnitude of the difference between said first voltage level and said second voltage level is greater than 50% of the magnitude of the supply voltage to said oscillator means.

4. Pulse width modulator apparatus for providing a waveform responsive to an input voltage, said apparatus comprising a quad comparator integrated circuit wherein:
   a first comparator is embodied as an oscillator for generating an output signal, said signal having alternate first portions, during each of which the output signal rises along a first path from a first voltage value to a second voltage value, and second portions, during each of which the output signal falls along a second path from said second value to said first value, at least one of said paths being nonlinear;
   a second comparator compares the output of said first comparator with said input voltage; and
   a third comparator, connected from the output of said second comparator, limits the maximum duty cycle.

5. The apparatus of claim 4 wherein a fourth comparator, connected to the output of said third comparator performs current limiting.

6. The apparatus of claim 1 wherein each said nonlinear path is an exponential curve.

* * * * *